US00RE35733E

United States Patent [19]

Hernandez et al.

[11] E Patent Number: Re. 35,733

[45] Reissued Date of Patent: Feb. 17, 1998

[54] DEVICE FOR INTERCONNECTING INTEGRATED CIRCUIT PACKAGES TO CIRCUIT BOARDS

[75] Inventors: Jorge M. Hernandez, Mesa, Ariz.; Scott S. Simpson, Woodstock, Conn.; Michael S. Hyslop, Phoenix, Ariz.

[73] Assignee: Circuit Components Incorporated, Tempe, Ariz.

[21] Appl. No.: 353,500

[22] Filed: Dec. 9, 1994

Related U.S. Patent Documents

Reissue of:

[64] Patent No.: 5,309,324
Issued: May 3, 1994
Appl. No.: 798,229
Filed: Nov. 26, 1991

[51] Int. Cl.[6] ..... H05K 7/00

[52] U.S. Cl. ..... 361/734; 361/763; 361/785; 361/811; 439/66

[58] Field of Search ..... 174/52.4; 257/678, 257/680, 690; 361/734, 735, 744, 763, 767, 769, 785, 787, 790, 811; 439/66–74, 91

[56] References Cited

U.S. PATENT DOCUMENTS

| | | |
|---|---|---|
| 4,045,105 | 8/1977 | Lee et al. . |
| 4,159,221 | 6/1979 | Schuessler . |
| 4,222,090 | 9/1980 | Jaffe . |
| 4,283,754 | 8/1981 | Parks . |
| 4,356,532 | 10/1982 | Donaher et al. . |
| 4,445,735 | 5/1984 | Bonnefoy . |
| 4,468,074 | 8/1984 | Gordon . |
| 4,516,186 | 5/1985 | Hardy et al. . |
| 4,521,828 | 6/1985 | Fanning . |
| 4,593,961 | 6/1986 | Cosmo . |
| 4,655,524 | 4/1987 | Etzel . |
| 4,779,164 | 10/1988 | Menzies, Jr. et al. . |
| 4,793,814 | 12/1988 | Zifcak et al. . |
| 4,830,623 | 5/1989 | Owens et al. . |
| 4,853,826 | 8/1989 | Hernandez . |
| 4,853,827 | 8/1989 | Hernandez . |
| 4,862,322 | 8/1989 | Bickford et al. . |
| 4,882,656 | 11/1989 | Menzies, Jr. et al. . |
| 4,903,113 | 2/1990 | Frankeny et al. . |
| 4,969,826 | 11/1990 | Grabbe . |
| 5,037,312 | 8/1991 | Casciotti et al. ..... 439/66 |
| 5,049,084 | 9/1991 | Bakke . |
| 5,069,629 | 12/1991 | Johnson . |

FOREIGN PATENT DOCUMENTS

| | | |
|---|---|---|
| 2639154 | 5/1990 | France ..... 439/66 |
| 2152753A | 8/1985 | United Kingdom . |

OTHER PUBLICATIONS

Johnstech International "Test Socket Performance Handbook", Oct. 1993.

*Primary Examiner*—Gregory D. Thompson
*Attorney, Agent, or Firm*—Fishman, Dionne, Cantor & Colburn

[57] ABSTRACT

A novel and improved device for interconnecting an integrated circuit package to a circuit board is presented. In accordance with the present invention an integrated circuit package having an central area devoid of surface contacts is positioned over a resilient or compressible connector system. The compressible connector includes an opening about its center which corresponds to the central area on the integrated circuit package. A component is mounted on the circuit board within the opening of the compressible connector between the integrated circuit package and the circuit board.

20 Claims, 5 Drawing Sheets

DEVICE FOR INTERCONNECTING INTEGRATED CIRCUIT PACKAGES TO CIRCUIT BOARDS

Matter enclosed in heavy brackets [ ] appears in the original patent but forms no part of this reissue specification; matter printed in italics indicates the additions made by reissue.

BACKGROUND OF THE INVENTION

This invention relates to schemes for interconnecting integrated circuit chip packages to circuit boards. More particularly, this invention relates to novel and improved schemes for interconnecting integrated circuit chip packages (such as land grid array type integrated circuit packages) having a center space under the chip package for housing a component which is sandwiched between the chip package and a circuit board.

It is well known in the field of micro-electronics that high frequency operation, particularly the switching of integrated circuits, can result in transient energy being coupled into the power supply circuit. Generally the prevention of the coupling of undesired high frequency noise or interference into the power supply for an integrated circuit is accomplished by connecting a decoupling capacitor between the power and the ground leads of the integrated circuit (IC).

One connection scheme which has been found to be quite successful is to mount a decoupling capacitor underneath an integrated circuit. Such decoupling capacitors are commonly available from Rogers Corporation, (assignee of the present application) and are sold under the trademark MICRO Q. Examples of these decoupling capacitors are found in U.S. Pat. Nos. 4,475,143; 4,502,101 and 4,748,537 all of which are assigned to the assignee hereof.

U.S. Pat. Nos. 4,626,958; 4,667,267; 4,658,327; 4,734,818; 4,734,819; 4,853,826 and 4,853,827 are also assigned to the assignee hereof and incorporated herein by reference. These patents disclose decoupling capacitors which are particularly well suited for pin grid array (PGA) and plastic leaded chip carrier packages. For example, the PGA decoupling capacitor of U.S. Pat. No 4,853,826 comprises a dielectric material sandwiched between a pair of conductors. A group of flat strips or skirts extend outwardly a short distance generally in the plane of the metal conductors to which they are attached and are then bent downwardly so as to extend in the direction which is perpendicular to the planes of the conductors. The entire assembly, with the exception of the flat strips (i.e., leads), may then be encapsulated within a suitable non-conductive material.

This flat decoupling capacitor adapted for mounting directly under the PGA package results in a lower decoupling loop, thus a more effective decoupling scheme. The capacitor of U.S. Pat. No. 4,853,826 also contributes to a savings in board space, i.e., takes up less "real estate" on the printed circuit board, by resting entirely underneath the PGA package.

It will be appreciated that the aforementioned decoupling capacitors are well suited for use in conjunction with PGA packages.

The land grid array (LGA) package is a ceramic leadless package (basically a pin-less version of a PGA package) which reduces propagation delays and other detrimental effects. The LGA package is generally smaller than its PGA counterpart (for the same number of I/O's) and has connection pads in a pitch matrix array (e.g., 0.050" pitch matrix array). The LGA package is installed (surface mounted) onto the printed circuit board (PCB), on a corresponding array of conductor pads which in turn are connected to the rest of the board circuitry by traces or otherwise.

The actual mechanical and electrical attachment of the LGA package to the PCB is accomplished by means of solder or by some connector system. One of the disadvantages of solder attachment is that the solder joints cannot be inspected and that flux residue cleaning is extremely difficult, due to the very small gap between the LGA package bottom surface and the surface of the PCB.

Also, in many applications, it is necessary or desirable to replace the IC package (LGA) to reconfigure the digital system (e.g., computers, industrial control, etc) or to upgrade it, thus requiring a connector system. Such a pad-to-pad demateable connector system is commonly available from Rogers Corporation, (assignee of the present application) and is sold under the trademark ISOCON. This system comprises a piece of silicone elastomeric material with an array of rectangular apertures or holes drilled at an angle with respect to the top and bottom surfaces. A generally "S" shaped conductor pin is inserted into each aperture. The connector operates under the principle of compressing the elastomer piece, making the "S" shaped conductor pins rotate slightly, thus providing the required "wipe" action to the LGA and PCB contacts. The elastomeric material provides the necessary spring back force to achieve an effective mechanical contact as well as a low resistance contact between the LGA and PCB pads. A hardware system is provided to control and maintain the compression of the elastomeric material and to provide alignment and registration between the LGA contacts and the PCB pads. This type of connector system is disclosed in U.S. Pat. No. 4,793,814, also assigned to assignee hereof and incorporated herein by reference.

Present decoupling practice for LGA package systems is to use one or several ceramic multi-layer chip (MLC) capacitors surface mounted on the PCB surrounding the LGA/Connector System. This practice suffers from several disadvantages. For example, the MLC capacitors, due to the area of the PCB occupied by the connector system itself, end up being located at relatively large distances from one another, i.e., the length of the electrical connections (made typically through the voltage and ground planes of the PCB) between the MLC capacitors and the voltage and ground pads of the PCB (connecting to the LGA) is large. This introduces large inductance in the decoupling loop, which results in noise in the power ground circuitry of the IC.

While well suited decoupling schemes for PGA packages are disclosed, a need exists for an improved decoupling scheme for use in conjunction with land grid array (LGA) type integrated circuit packages as well as for other IC chip packages having a central void or space therein.

SUMMARY OF THE INVENTION

The above-discussed and other problems and deficiencies of the prior art are overcome or alleviated by the novel device for interconnecting an integrated circuit package to a circuit board. The present invention relates generally to a scheme of interconnecting a integrated circuit (IC) chip package of the type having a central space thereunder to a circuit board using a compressible connector, with the compressible connector including an opening therethrough for housing a component which is sandwiched between the chip package and the circuit board.

In accordance with the present invention, an IC package having a central space (e.g., LGA) is positioned over a resilient or compressible connector system having an opening or gap therethrough. The compressible connector is disposed between the IC package and a printed circuit board. A decoupling capacitor is mounted within the gap of the compressible connector and is supported on the circuit board.

The present invention offers many features and advantages relative to the prior art. For example, inductance of the decoupling loop is lower due to the close proximity of the decoupling capacitor with respect to the IC package itself. Further, the close proximity of the capacitor to the IC package makes the scheme more effective in suppressing electrical switching noise from the voltage/ground circuitry, thus allowing the IC itself to be operated at higher switching rates and clock speeds. Printed circuit board space is saved, since the area under the IC package (devoid of I/0 pads) is presently not used for anything else except other PCB traces and for via interconnects to the interior of the PCB. This area can accommodate the capacitor of the present invention without sacrificing its present use (i.e., traces and via interconnects).

The above discussed and other features and advantages of the present invention will be appreciated and understood by those of ordinary skill in the art from the following detailed description and drawings.

BRIEF DESCRIPTION OF THE DRAWINGS

Referring now to the drawings wherein like elements are numbered alike in the several FIGURES.

DESCRIPTION OF THE PREFERRED EMBODIMENT

The present invention relates generally to a scheme of interconnecting a integrated circuit (IC) chip package of the type having a central space thereunder to a circuit board using a compressible connector, with the compressible connector including an opening therethrough for housing a component which is sandwiched between the chip package and the circuit board.

In the preferred embodiment described hereinafter, the IC chip package comprises a land grid array (LGA) package and the sandwiched component comprises a decoupling capacitor. However, it will be appreciated that the use of a LGA package and a decoupling capacitor are by example only. Other chip packages such as leaded or leadless chip carders with peripheral contacts having central cavities may be used in the present invention. In addition, the sandwiched component may alternatively include a heat dissipative or heat conductive element or a power transmission element for bridging power from the board to the IC package. Similarly, these alternative sandwiched components may include decoupling capacitive features.

The compressive connector is preferably of the type described in U.S. Pat. No. 4,793,814. However, many other compressive connectors are also well suited for this invention including PAI Land Grid Array Socket manufactured by Augat, Inc., Fuzz Button (a trademark of Technit, Inc.) manufactured by Cinch, Inc., Ampflat connectors manufactured by Amp, Inc. and MOE connectors manufactured by ETI, Inc.

Figure 1:
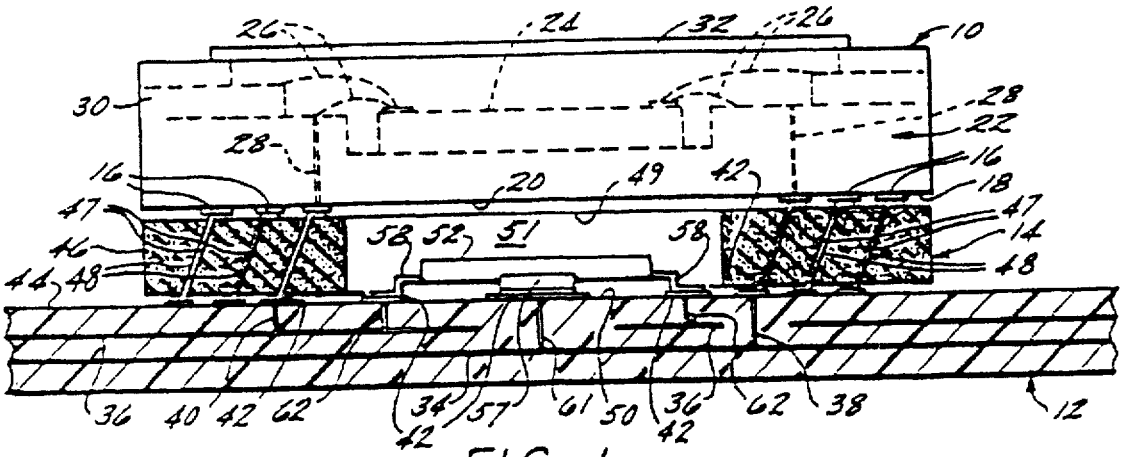
FIG. 1 is a side elevation view, partly in cross section, of a decoupling capacitor disposed in an opening of a connector between a land grid array integrated circuit package and a circuit board in accordance with the present invention, the connector and the circuit board being the portion of the view that is shown in cross section.
Figure 1A:
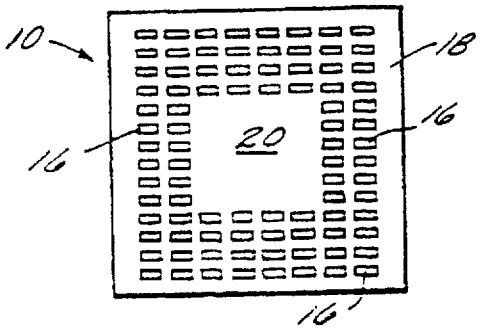
FIG. 1A is a bottom view of the land grid array integrated circuit package of FIG. 1.

Referring to FIG. 1, an improved decoupling scheme is shown. This decoupling scheme comprises a land grid array (LGA) integrated circuit 10 connected to a printed circuit board (PCB) 12 by a compression connector system 14 of the type disclosed in U.S. Pat. No. 4,793,814. However, connector 14 is shown in a compressed state. The hardware for compression of connector system 14, is not shown, with reference being made to U.S. Pat. No. 4,793,814 for those details.

LGA 10 has an array of contacts or input/output (I/O) connection pads 16 (FIG. IA) on a surface 18. Contacts 16 are illustrated as rectangular but may be any shape (e.g., square, circular, etc.). Surface 18 may be entirely populated by contacts 16 or, as in the present invention, an area 20 which is devoid of contacts 16. This will depend on the complexity of internal circuitry 22, which will dictate the number of I/O contacts 16 required. The internal circuitry 22 of LGA 10 generally comprises an IC die 24 connected by bonding wires 26 to interconnecting vias 28 which are connected to contacts 16. This circuitry is generally set in a ceramic or other electrically non-conductive material package 30, leaving the circuitry exposed from one side. A lid 32 (generally metallic) is affixed onto package 30 closing off the exposed circuitry.

PCB 12 is a multi-layer printed circuit board, however single and double sided PCB's may also be employed. PCB 12 has an electrically conductive film (i.e., a trace or plane) 34 which supplies voltage to LGA 10 and another electrically conductive film (i.e., trace or plane) 36 for providing a ground connection to LGA 10. Interconnecting vias 38 and 40 provide connection between planes 34 and 36 respectively and PCB contacts 42 on a surface 44 of PCB 12. The pattern of contacts 42 on surface 44 corresponds to the pattern of the components (e.g., LGA 10) to be connected to PCB 12. It will be appreciated that many electrical components (e.g., capacitors, resistors, IC's, etc.) may to be mounted on PCB 12.

Connector 14 comprises an elastomeric foam 46 (preferably silicone elastomeric material) which is shaped similar to LGA 10 and has a plurality of shaped conductor pins 47. Pins 47 are disposed in an array of apertures 48 which are angled with respect to a first surface 49 (which is adjacent to surface 18 of LGA 10), and to a second surface 50 (which is adjacent to surface 44 of PCB 12). Each end of pins 47 extend beyond foam 46 and run parallel thereto. The array of apertures 48 corresponds to both the contact pattern of LGA 10 and the pad pattern of PCB 12. Connector 14 operates when compressed by a hardware system (not shown). The hardware system maintains compression on connector 14 and assures alignment and proper registration between pins 47 and PCB contacts 42, and between pins 47 and LGA contacts 16. When connector 14 is compressed, pins 47 rotate slightly, thus providing the required "wipe" action to PCB contacts 42 and to LGA contacts 16. Elastomeric foam 46 provides the required spring back force to achieve an effective mechanical contact as well as low resistance between LGA contacts 16 and PCB contacts 42. Foam 46 has an opening 51 which is in alignment with area 20 of LGA 10 (i.e., the area on surface 18 of LGA 10 which is devoid of contacts 16).

Figure 2A:
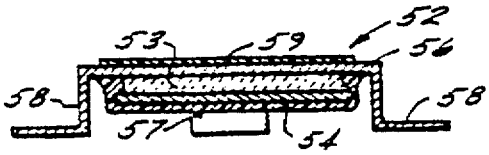
FIG. 2A is a cross sectional side elevation view of the decoupling capacitor of FIG. 1.
Figure 2B:
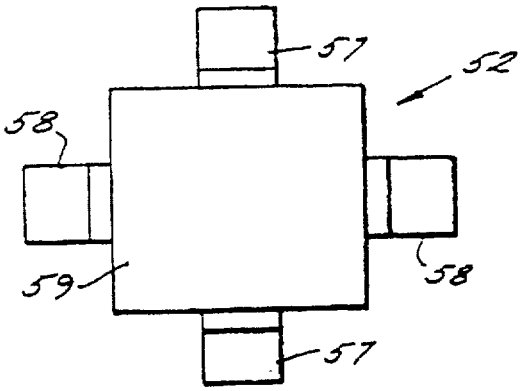
FIG. 2B is a top view of the decoupling capacitor of FIG. 1.

A decoupling capacitor 52 is surface mounted onto PCB 12 in opening 51 of connector 14. Preferably, decoupling capacitor 52 is of the type disclosed in U.S. Pat. No. 4,853,826, which is assigned to the assignee hereof and incorporated herein by reference. Referring also to FIGS. 2A and 2B, capacitor 52 has a single layer of dielectric material or a dielectric chip 53 sandwiched between metal conductors 54 and 56. Extending outwardly and downwardly from each of two sides of each conductor 54 and 56 are wide flat strips or skirts 57 and 58, respectively. An electrically non-conductive material 59 encapsulates capacitor 52 except for skirts 57 and 58 of conductors 54 and 55. Skirts 57 are connected to voltage plane 34 by vias 61 and contacts 42. Skirts 58 are connected to ground plane 36 by vias 62 and contacts 42. The capacitor 52 is located in opening 51 of connector 14. Connector 14 is compressed between LGA 10 and PCB 12 by the hardware of connector 14. Capacitor 52 is disposed between LGA 10 and PCB 12, thereby greatly increasing available PCB 12 space (i.e., "real estate") for other electrical components or alternatively the overall size of PCB 12 may be reduced accordingly. Further inductance of the decoupling loop is lower due to the closer proximity of capacitor 52 to LGA 10. This more effectively reduces switching noise thus allowing LGA 10 to be operated at higher switching rates and clock speeds.

Figure 3:
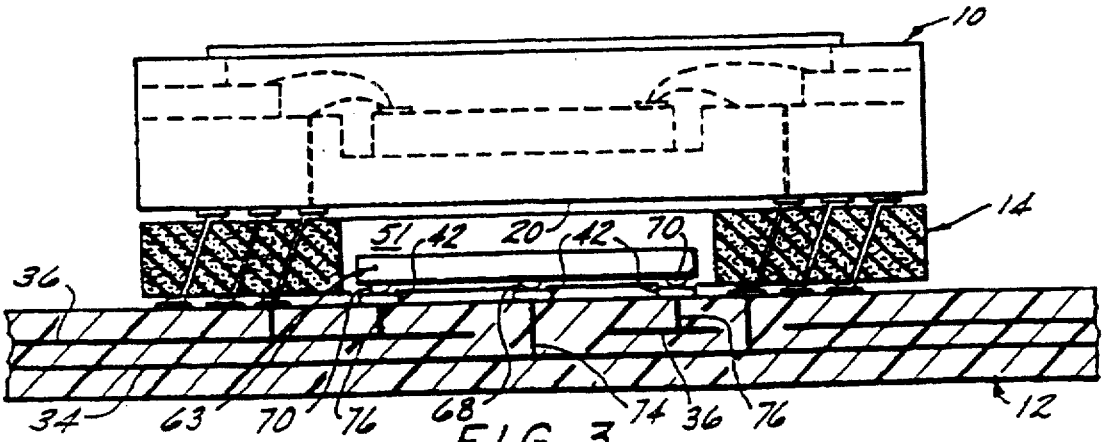
FIG. 3 is a side elevation view, partly in cross section, of a decoupling capacitor disposed in an opening of a connector between a land grid array integrated circuit package and a circuit board in accordance with a second embodiment of the present invention, the connector and the circuit board being the portion of the view that is shown in cross section.
Figure 4A:
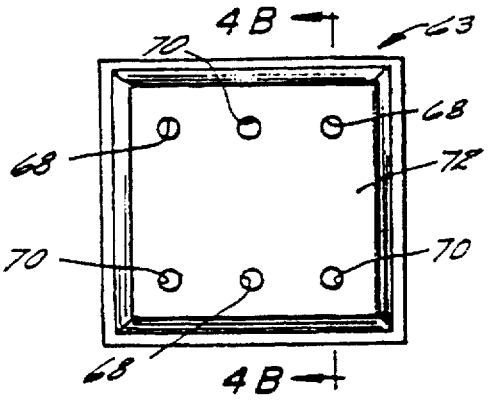
FIG. 4A is a bottom view of the decoupling capacitor of FIG. 3.
Figure 4B:
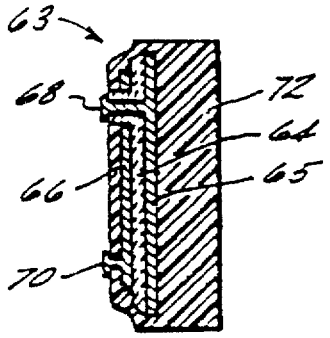
FIG. 4B is a cross sectional side elevation view of the decoupling capacitor of FIG. 3.

Referring to FIG. 3, a second embodiment of the present invention is shown, wherein like elements to the first embodiment are numbered alike. In accordance with the second embodiment, a flat thick film decoupling capacitor 63 is surface mounted onto PCB 12 under LGA 10 in opening 51 of connector 14. Referring also to FIGS. 4A and 4B, capacitor 63 has a single layer of dielectric material 64 sandwiched between metal conductors 65 and 66. Extending downwardly from one surface of each conductor 65 and 66 are three solder bumps 68 and 70, respectively. An electrically non-conductive material 72 encapsulates capacitor 63 except for bumps 68 and 70. Solder bumps 68 are connected to voltage plane 34 by vias 74, and contacts 42. Solder bumps 70 are connected to ground plane 36 by vias 76 and contacts 42. Capacitor 63 is disposed in opening 51 of connector 14, between LGA 10 and PCB 12 in accordance with the present invention.

Figure 5:
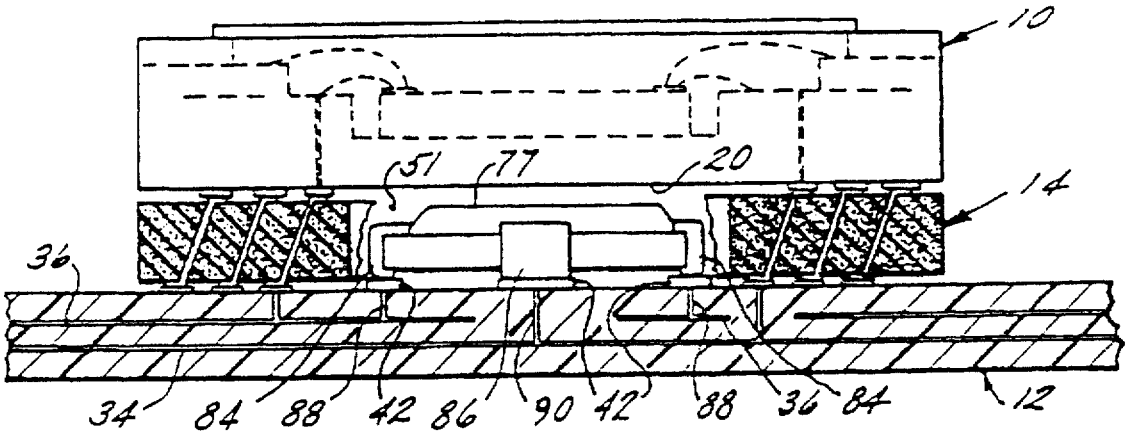
FIG. 5 is a side elevation view, partly in cross section, of a decoupling capacitor disposed in an opening of a connector between a land grid array integrated circuit package and a circuit board in accordance with a third embodiment of the present invention, the connector and the circuit board being the portion of the view that is shown in cross section.
Figure 6A:
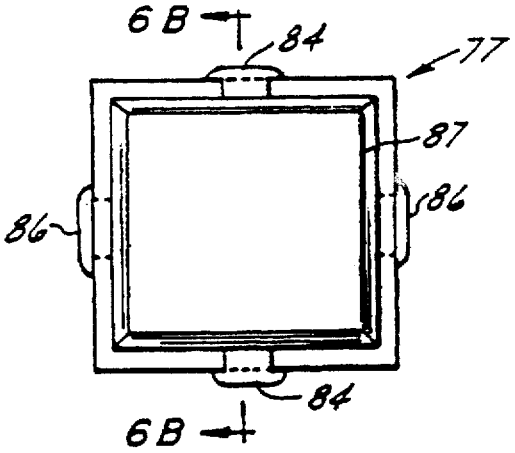
FIG. 6A is a top view of the decoupling capacitor of FIG. 5.
Figure 6B:
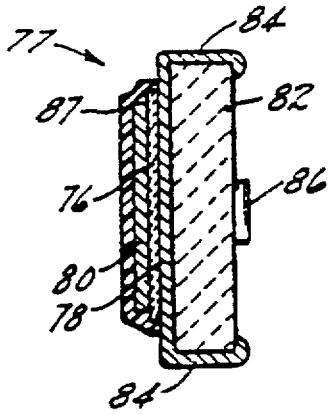
FIG. 6B is a cross sectional side elevation view of the decoupling capacitor of FIG. 5.

Referring to FIG. 5, a third embodiment of the present invention is shown wherein like elements to the first embodiment are numbered alike. In accordance with this third embodiment, a thick film ceramic flat decoupling capacitor 77 is surface mounted onto PCB 12 under LGA 10 in opening 51 of connector 14. Referring also to FIGS. 6A and 6B, capacitor 77 has a single layer of dielectric material 76 sandwiched between metal conductors 78 and 80. Extending outwardly and downwardly from two sides of each of conductors 78 and 80 are solder terminals 84 and 86, respectively. Terminals 84 and 86 run parallel along the four sides of a substrate 82. Substrate 82 is preferably a ceramic material (i.e., electrical non-conductive material) and encloses the lower portion of capacitor 77 with terminals 84 and 86 being on the sides of substrate 82. An electrically nonconductive material 87 encloses the upper portion of capacitor 77. Terminals 84 are connected to ground plane 36 by vias 88 and contacts 42. Terminals 86 are connected to voltage plane 34 by vias 90 and contacts 42. Capacitor 77 is disposed in opening 51 of connector 14, between LGA 10 and PCB 12 in accordance with the present invention.

Figure 7:
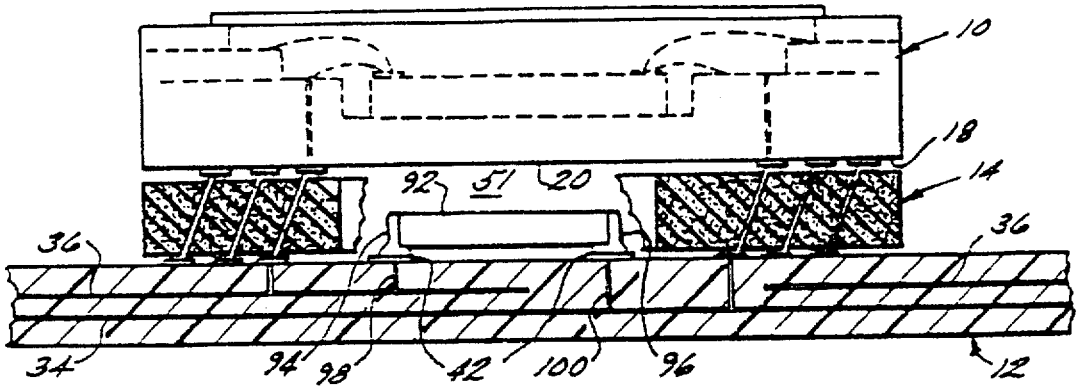
FIG. 7 is a side elevation view, partly in cross section, of a decoupling capacitor disposed in an opening of a connector between a land grid array integrated circuit package and a circuit board in accordance with a fourth embodiment of the present invention, the connector and the circuit board being the potion of the view that is shown in cross section.

Referring to FIG. 7, a fourth embodiment of the present invention is shown, wherein like element to the first embodiment are numbered alike. A multi-layer ceramic chip (MLC) decoupling capacitor 92 is surface mounted onto PCB 12 under LGA 10 in opening 51 of connector 14. Capacitor 92 has two terminals 94 and 96 which correspond to two metal conductors with a single layer of dielectric material sandwiched therebetween. Terminal 94 is connected to ground plane 36 by via 98 and contact 42. Terminal 96 is connected to voltage plane 34 by via 100 and contact 42. Capacitor 92 is disposed in opening 51 of connector 14, between LGA 10 and PCB 12 in accordance with the present invention.

Figure 8:
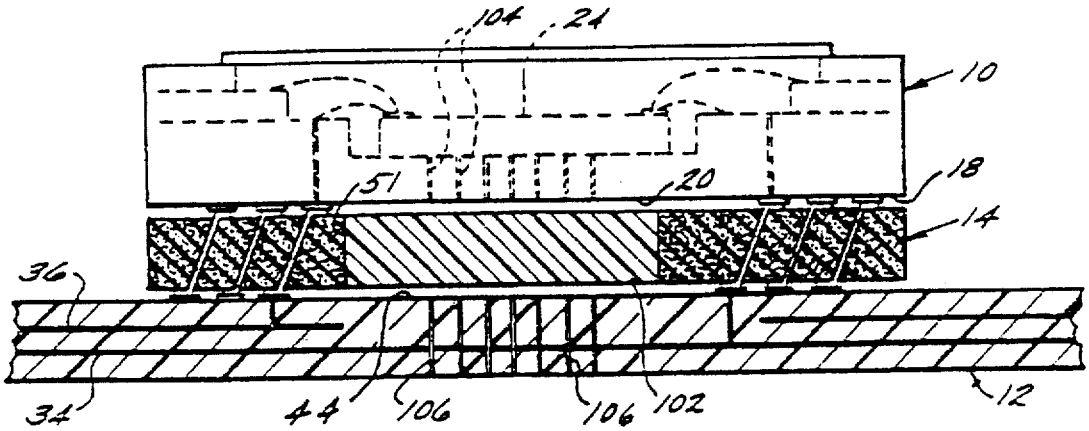
FIG. 8 is a side elevation view, partly in cross section, of a thermal conductor disposing in an opening of a connector between a land grid array integrated circuit package and a circuit board in accordance with a fifth embodiment of the present invention, the connector, the thermal conductor, and the circuit board being the portion of the view that is shown in cress section.

Referring to FIG. 8, a fifth embodiment of the present invention is shown, wherein like elements to the first embodiment are numbered alike. In accordance with the fifth embodiment, a thermal conductor 102 is disposed in opening 51 of connector 14. Thermal conductor 102 completely fills opening 51 as is shown in FIG. 8. Thermal conductor 102 preferably comprises carbon fiber filled silicone rubber, although other thermally conductive materials may be employed (e.g., thermal bags which are generally copper coated and filled with fluorinated heat conducting liquid).

LGA 10 of FIG. 8 differs from the first embodiment in that a plurality of interconnecting vias 104 are connected between IC die 24 and surface 18 at area 20. Vias 104 conduct heat away from IC die 24 and to conductor 102. It will be appreciated that area 20 of surface 18 is to be thermally conductive. Additionally, PCB 12 differs from the first embodiment in that a plurality of interconnecting vias 106 are connected between the upper surface 44 and the lower surface of PCB 12. Vias 106 are located below conductor 102 to facilitate thermal conduction away from thermal conductor 102 and LGA 10. Thermal conductor 102 is disposed in opening 51 of connector 14, between LGA 10 and PCB 12 in accordance with the present invention.

Figure 9:
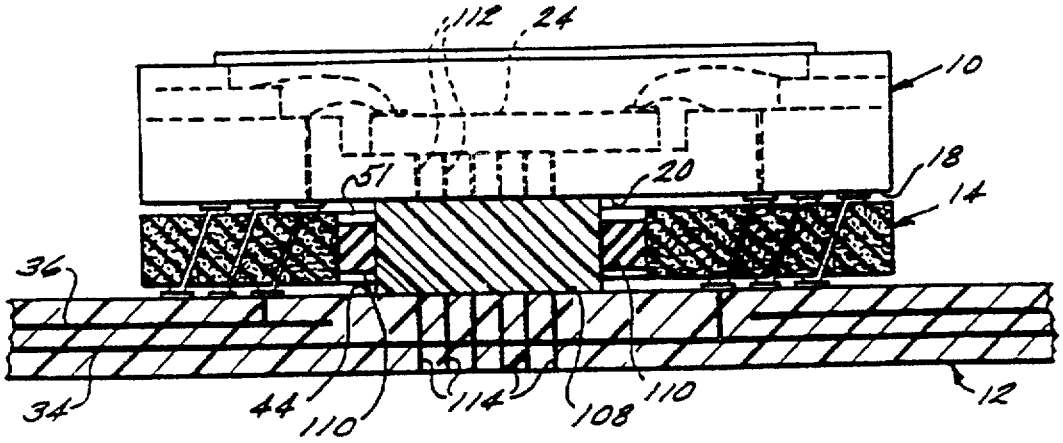
FIG. 9 is a side elevation view, partly in cross section, of a thermal conductor employing a peripheral compression stop disposed in an opening of a connector between a land grid array integrated circuit package and a circuit board in accordance with a sixth embodiment of the present invention, the connector, the thermal conductor, the compression stop and the circuit board being the portion of the view that is shown in cross section.

Referring to FIG. 9, a sixth embodiment of the present invention is shown, wherein like elements to the first embodiment are numbered alike. In accordance with the sixth embodiment, a thermal conductor 108 is disposed in opening 51 of connector 14. A compression stop 110 is peripherally disposed about conductor 108. Thermal conductor 108 and compression stop 110 completely fill opening 51 as is shown in FIG. 9. Thermal conductor 108 preferably comprises carbon fiber filled silicone rubber, although other thermally conductive materials may be employed (e.g., thermal bags which are generally copper coated and filled with fluorinated heat conducting liquid).

LGA 10 of FIG. 9 differs from the first embodiment in that a plurality of interconnecting vias 112 are connected between IC die 24 and surface 18 at area 20. Vias 112 conduct heat away from IC die 24 to conductor 108. It will be appreciated that area 20 of surface 18 is to be thermally conductive. Additionally, PCB 12 differs from the first embodiment in that a plurality of interconnecting vias 104 are connected between the upper surface 44 and the lower surface of PCB 12. Vias 114 are located below conductor 108 to facilitate thermal conduction away from thermal conductor 108 and LGA 10. Thermal conductor 108 and compression stop 110 are disposed in opening 51 of connector 14, between LGA 10 and PCB 12 in accordance with the present invention.

Figure 10:
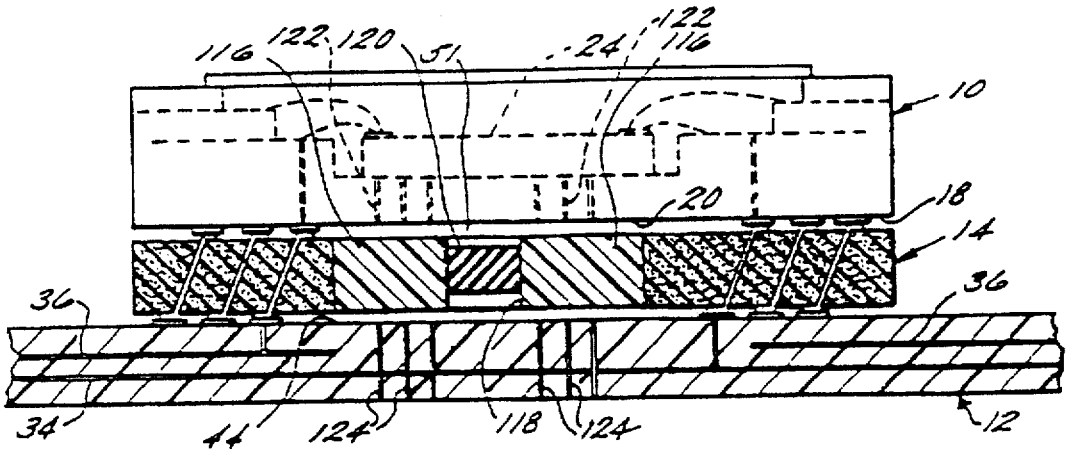
FIG. 10 is a side elevation view, partly in cross section, of a thermal conductor employing a central compression stop disposed in an opening of a connector between a land grid array integrated circuit package and a circuit board in accordance with a seventh embodiment of the present invention, the connector, the thermal conductor, the compression stop and the circuit board being the portion of the view that is shown in cross section.

Referring to FIG. 10, a seventh embodiment of the present invention is shown, wherein like elements to the first embodiment are numbered alike. In accordance with the seventh embodiment, a thermal conductor 116 having a central aperture 118 is disposed in opening 51 of connector 14. A compression stop 120 is disposed in aperture 118. Thermal conductor 116 and compression stop 110 completely fill opening 51 as is shown in FIG. 10. Thermal conductor 116 preferably comprises carbon fiber filled silicone rubber, although other thermally conductive materials may be employed (e.g., thermal bags which are generally copper coated and filled with fluorinated heat conducting liquid).

LGA 10 of FIG. 10 differs from the first embodiment in that a plurality of interconnecting vias 122 are connected between IC die 24 and surface 18 at area 20. Vias 122 conduct heat away from IC die 24 and to conductor 116. It will be appreciated that area 20 of surface 18 is to be thermally conductive. Additionally, PCB 12 differs from the first embodiment in that a plurality of interconnecting vias 124 are connected between the upper surface 44 and the lower surface of PCB 12. Vias 124 are located below conductor 116 to facilitate thermal conduction away from thermal conductor 116 and LGA 10. Thermal conductor 116 and compression stop 120 are disposed in opening 51 of connector 14, between LGA 10 and PCB 12 in accordance with the present invention.

Figure 11:
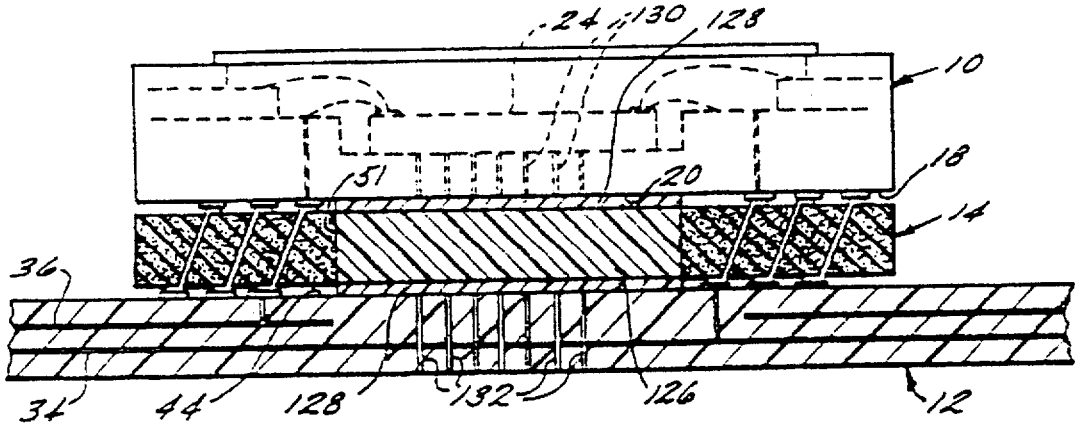
FIG. 11 is a side elevation view, partly in cross section, of a thermal conductor disposed in an opening of a connector between a land grid array integrated circuit package and a circuit board in accordance with an eighth embodiment of the present invention, the connector, the thermal conductor and the circuit board being the portion of the view that is shown in cross section.

Referring to FIG. 11, an eighth embodiment of the present invention is shown, wherein like elements to the first embodiment are numbered alike. In accordance with the eighth embodiment, a thermal conductor 126 is disposed in opening 51 of connector 14. Thermal conductor 126 fills most of opening 51 except for the gaps above and below conductor 126 which are filled with a thermally conductive adhesive or gel 128. Thermal conductor 126 preferably comprises carbon fiber filled silicone rubber, although other thermally conductive materials may be employed (e.g., thermal bags which are generally copper coated and filled with fluorinated heat conducting liquid).

LGA 10 of FIG. 11 differs from the first embodiment in that a plurality of interconnecting vias 130 are connected between IC die 24 and surface 18 at area 20. Vias 130 conduct heat away from IC die 24 and to conductor 126. It will be appreciated that area 20 of surface 18 is to be thermally conductive. Additionally, PCB 12 differs from the first embodiment in that a plurality of interconnecting vias 132 are connected between the upper surface 44 and the lower surface of PCB 12. Vias 132 are located below conductor 126 to facilitate thermal conduction away from thermal conductor 126 and LGA 10. Thermal conductor 126 is disposed in opening 51 of connector 14, between LGA 10 and PCB 12 in accordance with the present invention.

Figure 12:
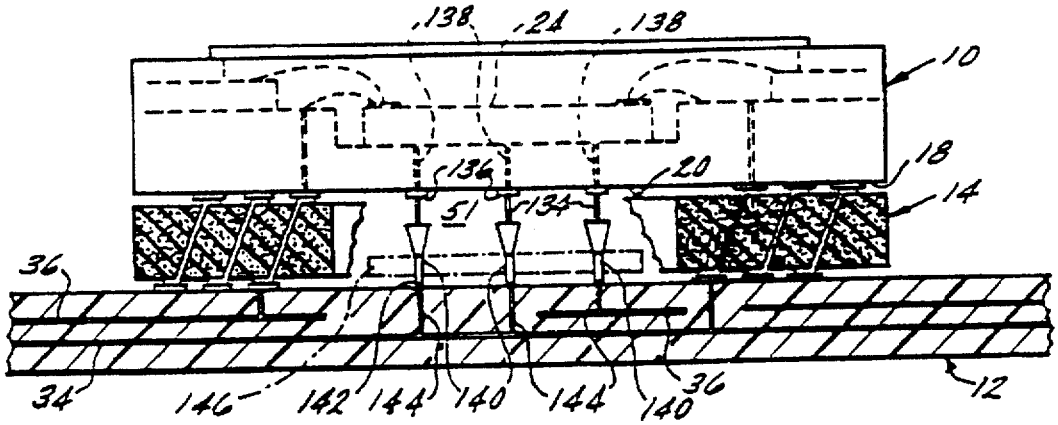
FIG. 12 is a side elevation view, partly in cross section, of an interconnecting device disposed in an opening of a connector between a land grid array integrated circuit package and a circuit board in accordance with a nineth embodiment of the present invention the connector and the circuit board being the portion of the view that is shown in cross section.

Referring to FIG. 12, a nineth embodiment of the present invention is shown wherein like elements to the first embodiment are numbered alike. In accordance with the nineth embodiment, a plurality of interconnecting pins 134 extend downwardly from corresponding contact surfaces 136 located on surface 18 of LGA 10 at area 20. Contacts 136 are connected to IC die 24 by vias 138 to provide power to LGA 10. Pins 134 mate with sockets 140 which are connected to power planes 34 and 36 via feed holes 142 and vias 144 in PCB 12. Pins 134 and sockets 140 are collectively referred to herein as interconnecting elements. Sockets 140 may be soldered or otherwise connected to facilitate a reliable electrical connection. Sockets 140 may be secured in an optional board 146 to assure alignment of sockets 140 with pins 134. Pins 134 and sockets 140 are disposed in opening 51 of connector 14 between LGA 10 and PCB 12 in accordance with the present invention.

Figure 13:
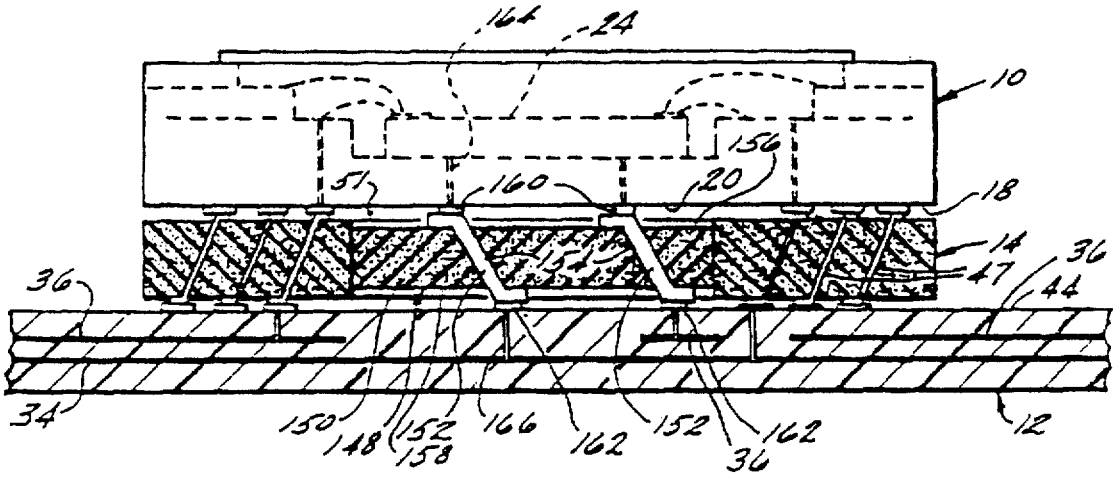
FIG. 13 is a side elevation view, partly in cross section, of a thermal conductor disposed in an opening of a connector between a land grid array integrated circuit package and a circuit board in accordance with a tenth embodiment of the present invention, both connectors and the circuit board being the portion of the view that is shown in cross section.

Referring to FIG. 13, a tenth embodiment of the present invention is shown wherein like elements to the first embodiment are numbered alike. In accordance with the tenth embodiment, a compression connector 148 is disposed in opening 51 of connector 14. Connector 148 comprises an elastomeric foam 150 which is shaped to fill opening 51 and has a plurality of "S" shaped conductor pins 152. Pins 152 are disposed in corresponding apertures 154 which are angled with respect to a first surface 156, which is adjacent to area 20 of surface 18, and a second surface 158, which is adjacent to surface 44 of PCB 12. Each of pins 152 extend beyond foam 150 and run parallel thereto. Apertures 154 correspond to contact surfaces 160 on LGA 10 and contact pads 162 on PCB 12. Connector 148 does not require an additional hardware system to maintain compression. The compression maintained by the hardware system of connector 14 will suffice to compress both connectors 14 and 148. When the connectors are compressed, pins 152 rotate slightly, thus providing the required "wipe" action to contacts 160 and 162. Elastomeric foam 150 provides the required spring back force to achieve an effective mechanical contact (within opening 51) as well as low resistance between contacts 160 and 162. Contacts 160 are connected to IC die 24 by vias 164 to provide power to LGA 10. Pads 162 are connected to power planes 34 and 36 by vias 166. Pins 154 are expected to be comprised of larger gauge pins than pins 47 in order to satisfy increased power requirements.

Although connector 148 has been described for power transmission, pins 154 may be employed to conduct heat away from LGA 10 is a manner similar to that described hereinbefore. Connector 148 is disposed in opening 51 of connector 14 between LGA 10 and PCB 12 in accordance with the present invention.

Figure 14:
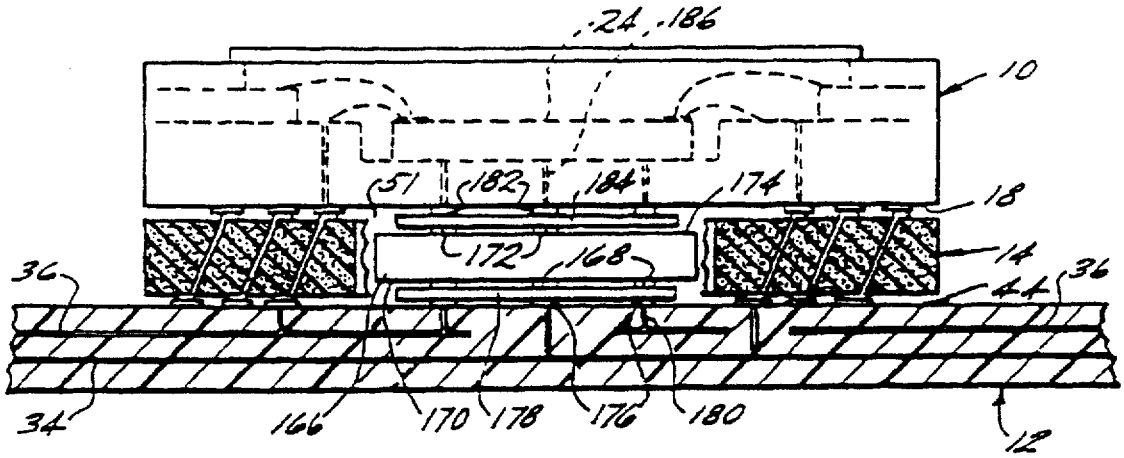
FIG. 14 is a side elevation view, partly in cross section, of a resistor pack employing an interconnecting device disposed in an opening of a connector between a land grid array integrated circuit package and a circuit board in accordance with an eleventh embodiment of the present invention, the connector and the circuit board being the portion of the view that is shown in cross section.

Referring to FIG. 14, an eleventh embodiment of the present invention is shown wherein like elements to the first embodiment are numbered alike. In accordance with the eleventh embodiment, a resistor pack 166 is disposed in opening 51 of Connector 14. Resistor pack 166 comprises a plurality of resistors (e.g., pull-up and pull-down resistors commonly used in digital logic circuits). A first plurality of contact pads 168 are disposed on a first surface 170 of resistor pack 166 and a second plurality of contact pads 172 are disposed on a second surface 174 of resistor pack 166. The internal resistors of pack 166 are interconnected by pads 168 and 172. PCB 12 has pads 176 on surface 44 which correspond to pads 168. Pads 168 and 176 are connected by a strip of connector material 178. Strip 178 may comprise orientated stacks of silver coated nickel spheres in a solid silicone (e.g., ECPI connect material manufactured by AT&T), fine wires oriented vertically in a strip of thin elastomer, alternating columns of conductive and non-conductive elastomer, or any other type of strip which will facilitate reliable electrical connection between pads 168 and 176. Pads 176 are connected to planes 34 and 36 by vias 180.

LGA 10 of FIG. 14 has contact surfaces 182 at area 20 of surface 18 which correspond to pads 172 of resistor pack 166. Contacts 172 and 182 are connected by another strip of connector material 184, similar to strip 178. Contacts 182 are connected to IC die 24 by vias 186 to provide connections of the resistors. Resistor pack 166 is disposed in opening 51 of connector 14 between LGA 10 and PCB 12 in accordance with the present invention. It is preferred chat resistor pack 166 completely fill opening 51 in order to maintain the proper alignment of pack 166, strips 178 and 184 relative to contacts 176 and 182.

Although the eleventh embodiment describes a resistor pack 166 employing connector strips 178, 184, a decoupling capacitor employing one of the strips 178 may be used without departing from the spirit or scope of the present invention. Further, other electrical devices may be disposed in opening 51 in the manner set forth hereinabove.

While preferred embodiments have been shown and described, various modifications and substitutions may be made thereto without departing from the spirit and scope of the invention. Accordingly, it is to be understood that the present invention has been described by way of illustrations and not limitations.

What is claimed is:

1. An electronic subassembly comprising:

an integrated circuit (IC) package, said IC package comprising a land grid array package, said land grid array package having an array of contacts on one surface thereof surrounding a contact free area, at least one of said contacts being a first contact, said first contact being receptive to a first voltage level, at least one other of said contacts being a second contact, said second contact being receptive to a second voltage level;

circuit board means having a plurality of pads, an array of which corresponds to said array of contacts of said land grid array package, at least one of said pads being a first pad, said at least one first pad corresponding to said at least one first contact, said first pad being electrically connected to at least one second pad and having said first voltage level thereon, at least one other of said pads being a third pad, said at least one third pad corresponding to said at least one second contact, said third pad being electrically connected to at least one fourth pad and having said second voltage level thereon, said second and fourth pads being disposed at an area on said circuit board means corresponding to said contact free area of said land grid array package;

first compressible connector means sandwiched between said IC package and said circuit board means, said connector means electrically and mechanically interconnecting said IC package to said circuit board means, said first compressible connector means including an opening therethrough, said opening being disposed under said contact free area of said IC package; and a decoupling capacitor disposed in said opening and connected to said circuit board means, said decoupling capacitor providing decoupling capacitance between said first and second voltage levels on said land grid array package, said decoupling capacitor being in communication with said second and fourth pads on said circuit board means.

2. The apparatus of claim 1 wherein said first compressible connector means comprises:

a first electrically non-conductive support member having an array of apertures therethrough [said array of apertures corresponding to said array of contacts of said land grid array package] said first support member comprising resilient elastomeric foam material, said first support member having support surfaces to be respectively opposed to the surfaces of said circuit board means and said land grid array package and being adapted to be compressed by urging said circuit board means and said land grid array package together; and a first plurality of bodily-rotatable, electrically conductive interconnect elements, each comprising a body extending generally in the direction of the thickness of the resilient elastomeric foam support member and tab portions projecting angularly from the respective ends of said body, each of said first elements defining a pair of engagement surfaces disposed to engage respective ones of corresponding said pads of said circuit board means at one end and to engage respective ones of corresponding said contacts of said land grid array package at the other end, a line projected through said engagement surfaces being disposed at an initial acute angle to the direction of thickness of said first support member, and said tab portions defining engagement surfaces disposed at least closely in opposition to said support surfaces of said first support member to engage upon said support surfaces during bodily rotation of said first interconnect element to locally compress the elastomeric foam of said first support member, whereby, when said first compressible connector means is disposed between said circuit board means and said land grid array package in a clamped together relationship with said first interconnect elements in registry with said corresponding pads of said circuit board means and said corresponding contacts of said land grid array package, and with said first interconnect elements rotated bodily as a result of said clamping so that said line projected through said engagement surfaces of each element lies at an acute angle resiliently supported by said elastomeric foam to bear with force upon said pads of said circuit board means and said contacts of said land grid array package, and said voids of [said] elastomeric foam of said first support member serve locally to accommodate bodily rotation of said first interconnect elements in a manner avoiding disturbance of adjacent elements whereby displacement of the elastomeric foam material of said first support member about each said first interconnect element is limited generally to the local region of each corresponding said first element.

3. The apparatus of claim 1 wherein said decoupling capacitor comprises:

a capacitive element having a pair of opposed surfaces;

a first multi-sided conductor on one of said opposed surfaces of said capacitive element;

a second multi-sided conductor on the other of the said opposed surfaces of said capacitive element;

a plurality of first skirt means extending outwardly and downwardly from said first conductor, one each of said first skirt means extending from at least two of said sides of said first conductor, at least one of said first skirt means being connected to one of said at least one second pad of said circuit board means and being in communication with said first voltage level; and a plurality of second skirt means extending outwardly and downwardly from said second conductor, one each of said second skirt means extending from at least two of said sides of said second conductor, at least one of said second skirt means being connected to one of said at least one fourth pad of said circuit board means and being in communication with said second voltage level.

4. The apparatus of claim 3 wherein said decoupling capacitor means further includes:

an insulating material surrounding said first and second conductors with said first and second skirt means extending through said insulating material.

5. The apparatus of claim 3 wherein:

said capacitive element comprises a flat layer of dielectric material.

6. The apparatus of claim 3 wherein:

said first and second conductors have a rectangular shape with each conductor having two of said skirt means, each one of said skirt means extends from opposed sides of each conductor.

7. The apparatus of claim 1 wherein said decoupling capacitor comprises:

a capacitive element having a pair of opposed surfaces;

a first multi-sided conductor on one of said opposed surfaces of said capacitive element;

a second multi-sided conductor on the other of the said opposed surfaces of said capacitive element;

a plurality of first solder bump means extending downwardly from one surface of said first conductor, at least one of said first solder bump means being connected to one of said at least one second pad of said circuit board means and being in communication with said first voltage level; and a plurality of second solder bump means extending downwardly from one surface of said second conductor, said second solder bump means extending in the same direction as said first solder bump means, at least one of said second solder bump means being connected to one of said at least one fourth pad of said circuit board means and being in communication with said second voltage level.

8. The apparatus of claim 7 wherein said decoupling capacitor means further includes:

an insulating material surrounding said first and second conductors with said first and second solder bump means extending through said insulating material.

9. The apparatus of claim 7 wherein:

said capacitive element comprises a flat layer of dielectric material.

10. The apparatus of claim 1 wherein said decoupling capacitor comprises:

a capacitive element having a pair of opposed surfaces;

a first multi-sided conductor on one of said opposed surfaces of said capacitive element;

a second multi-sided conductor on the other of the said opposed surfaces of said capacitive element;

a non-conductive substrate whereupon one surface of said second conductor is disposed:

a plurality of first terminal means extending downwardly from said first conductor, one each of said first terminal means extending from at least two of said sides of said first conductor and extending adjacent to the corresponding sides of said substrate, at least one of said first terminal means being connected to one of said at least one second pad of said circuit board means and being in communication with said first voltage level; and a plurality of second terminal means extending downwardly from said second conductor, one each of said second terminal means extending from at least two of said sides of said second conductor and extending adjacent to the corresponding sides of said substrate, at least one of said second terminal means being connected to one of said at least one fourth pad of said circuit board means and being in communication with said second voltage level.

11. The apparatus of claim 10 wherein said decoupling capacitor further includes:

an insulating material disposed on one surface of said first conductor and extending downwardly along said sides of said first and second conductors to said substrate with said first and second terminal means extending through said insulating material.

12. The apparatus of claim 10 wherein:

said capacitive element comprises a flat layer of dielectric material.

13. The apparatus of claim 10 wherein:

said first and second conductors have a rectangular shape with each conductor having two of said terminal means, each one of said terminal means extends from opposed sides of each conductor.

14. The apparatus of claim 1 wherein said decoupling capacitor comprises:

a capacitive element having a pair of opposed surfaces;

a first multi-sided conductor on one of said opposed surfaces of said capacitive element;

a second multi-sided conductor on the other of the said opposed surfaces of said capacitive element;

first surface mount terminal means extending outwardly and downwardly from one side of said first conductor, said first surface mount terminal means being connected to one of said at least one second pad of said circuit board means and being in communication with said first voltage level; and second surface mount terminal means extending outwardly and downwardly from one side of said second conductor, said second surface mount terminal means being connected to one of said at least one fourth pad of said circuit board means and being in communication with said second voltage level.

15. The apparatus of claim 14 wherein said decoupling capacitor further includes:

an insulating material surrounding said first and second conductors with said first and second surface mount terminal means extending through said insulating material.

16. The apparatus of claim 14 wherein:

said capacitive element comprises a flat layer of dielectric material.

*17. An electronic subassembly comprising:*

*a discrete integrated circuit (IC) package, said IC package having an array of contacts on one surface thereof surrounding a contact free area, at least one of said contacts being a first contact, said first contact being receptive to a first voltage level, at least one other of said contacts being a second contact, said second contact being receptive to a second voltage level;*

*a circuit board means having a plurality of pads, an array of which corresponds to said array of contacts of said IC package, at least one first pad corresponding to said at least one first contact, said first pad being electrically connected to at least one second pad and having said first voltage level thereon, at least one other of said pads being a third pad, said at least one third pad corresponding to said at least one second contact, said third pad being electrically connected to at least one fourth pad and having said second voltage level hereon, said second and fourth pads being disposed at an area on said circuit board means corresponding to said contact free area of said IC; and*

*a first compressible connector means sandwiched between said IC package and said circuit board means, said connector means directly electrically and mechanically interconnecting said IC package to said circuit board means, said first compressible connector means including an opening therethrough, said opening being disposed under said contract free area of said IC package;*

*a decoupling capacitor disposed in said opening and connected to said circuit board means said decoupling capacitor providing decoupling capacitance between said first and second voltage levels on said IC package, said decoupling capacitor being in communication with said second and fourth pads on stud circuit board means.*

*18. The electronic subassembly of claim 17 wherein:*

*said discrete IC package comprises a land grid array package.*

*19. The electronic subassembly of claim 17 wherein said compressible connector means comprises:*

*an electrically non-conductive resilient elastomeric foam support member;*

*an array of spaced movable electrically conductive interconnect elements supported in said support member, said array of interconnect elements corresponding to said array of contacts of said IC package wherein said interconnect elements are movable between (1) a connected position where said elements electrically interconnect said array of contacts to said pads on said circuit board means and (2) a disconnected position where said elements are electrically out of contact with said array of contacts and said pads.*

*20. The apparatus of claim 3 wherein said first compressible connector means comprises:*

*a first electrically non-conductive support member having an array of apertures therethrough said first support member comprising resilient elastomeric foam material, said first support member having support surfaces to be respectively opposed to the surfaces of said circuit board means and said land grid array package and being adapted to be compressed by urging said circuit board means said IC package together; and*

*a first plurality of bodily rotatable, electrically conductive interconnect elements, each comprising a body extending generally in the direction of the thickness of the resilient elastomeric foam support member and tab portions projecting angularly from the respective ends of said body, each of said first elements defining a pair of engagement surfaces disposed to engage respective ones of corresponding said pads of said circuit board means at one end and to engage respective ones of corresponding said contacts of said IC package at the other end, a line projected through said engagement surfaces being disposed at an initial acute angle to the direction of thickness of said first support member, and said tab portions defining engagement surfaces disposed at least closely in opposition to said support surfaces of said first support member to engage upon said support surfaces during bodily rotation of said first interconnect element to locally compress the elastomeric foam of said first support member, whereby, when said first compressible connector means is disposed between said circuit board means and said IC package in a clamped together relationship with said first interconnect elements in registry with said corresponding pads of said circuit board means and said*

*corresponding contacts of said IC package, and with said first interconnect elements rotated bodily as a result of said clamping so that said line projected through said engagement surfaces of each element has at an acute angle resiliently supported by said elastomeric foam to bear with force upon said pads of said circuit board means and said contacts of said IC package, and of said elastomeric foam of said first support member serve locally to accommodate bodily rotation of said first interconnect elements in a manner avoiding disturbance of adjacent element whereby displacement of the elastomeric foam material of said first support member about each said first interconnect element is limited generally to the local region of each corresponding said first element.*

* * * * *